United States Patent
Wang et al.

[11] Patent Number: 6,110,841
[45] Date of Patent: Aug. 29, 2000

[54] METHOD FOR AVOIDING PLASMA DAMAGE

[75] Inventors: Mu-Chun Wang, Hsinchu Hsien; Yih-Jau Chang, Hsinchu, both of Taiwan

[73] Assignees: United Microelectronics Corp.; United Silicon Incorporated, both of Hsinchu, Taiwan

[21] Appl. No.: 09/418,144

[22] Filed: Oct. 14, 1999

[51] Int. Cl.$^7$ ........................................... H01L 21/31
[52] U.S. Cl. ..................... 438/766; 438/514; 438/506; 438/542
[58] Field of Search ..................... 438/514, 585, 438/766, 765, 689, 706, 506, 450, 542, 543

[56] References Cited

U.S. PATENT DOCUMENTS

| | | | |
|---|---|---|---|
| 5,908,312 | 6/1999 | Cheung et al. | 438/287 |
| 5,998,299 | 12/1999 | Krishnan | 438/694 |

OTHER PUBLICATIONS

J. P. McVittie, "Plasma Charging Damage: An Overview", 1996 1st International symposium on Plasma Process–Induced Damage, May 13–14, 1996, American Vacuum Society, 1996.

*Primary Examiner*—Tuan H. Nguyen
*Assistant Examiner*—Hsien-Ming Lee
*Attorney, Agent, or Firm*—Thomas, Kayden, Horstemeyer & Risley

[57] ABSTRACT

A method for avoiding plasma damage. In a semiconductor substrate of a first conductive type, a second conductive type well is formed. While forming the second conductive well, a high-energy dopant is doped into the semiconductor substrate. The high energy makes a depletion region between the substrate and the well have defects. A leakage path is thus formed. The leakage path can direct any charged carriers coming from plasma to avoid accumulation of the charged carriers in the well. Thus, the electrical characteristics of the well or even the quality of gate oxide formed thereon is prevented from being degraded.

14 Claims, 1 Drawing Sheet

METHOD FOR AVOIDING PLASMA DAMAGE

BACKGROUND OF THE INVENTION

1. Field of the Invention

The invention relates in general to a method for preventing a semiconductor device from being damaged, and more particularly to a method for avoiding plasma damage of a semiconductor device.

2. Description of the Related Art

Most of device damages or wafer defects in fabrication usually result from plasma process. Unfortunately, plasma processes are very essential in semiconductor fabrication, such dry etching or doping processes. During the plasma processes, the wafer is bombard by energetic ions and results in a damage. In addition, since the plasma ions carry a lot of charges, the wafer may also be damaged due to static charge accumulation. For example, energetic plasma ions can penetrate through a gate to damage the gate, and further leave their charges inside the gate. These charges from the ions accumulate in a gate oxide layer, resulting in a degradation of its isolation performance. A device current leakage is therefore induced. All these various kinds of damage resulting from plasma processes are called plasma process induced damage (PPID).

For example, before forming metal layers, a transistor having a gate structure is formed on a semiconductor substrate. Plasma can penetrate the gate structure and then damage a gate oxide layer under the gate structure. Furthermore, charge ions from the plasma are easily trapped in the gate oxide layer. When the charge ions accumulate to a certain level, the charge ions then penetrate through the gate oxide layer to the substrate. This degrades the isolation of the gate oxide layer and induces leakage of the semiconductor device, especially of a semiconductor device having a N-well.

Additionally, in an integrated circuit, after the formation of certain devices, there are still some processes to be performed to complete the circuit layout. For example, after a PMOS or an NMOS is formed on a substrate, to obtain an electrical connection between PMOS or NMOS and other devices or terminals, a conductive layer is formed and patterned. When patterning the conductive layer, an etching step is inevitable. The plasma or other charged particles used to etch the conductive layer very often damage the NMOS or PMOS formed on the substrate.

For example, a P-type substrate comprises an N-well therein. The P-type substrate is typically placed on or connected to a chuck which is grounded. Therefore, any charged carriers coming from the plasma can be directed to the chuck to be grounded via the P-type substrate. However, if the charged carriers are absorbed by the N-well, these carriers have no path for dissipation or neutralization. As a result, the charged carriers accumulate in the N-well, and thus the electrical characteristics of the N-well or even the quality of gate oxide formed thereon is seriously degraded.

In addition since the N-well is formed in and adjacent to the P-type substrate a depletion region is formed between the P-type substrate and the N-well. A potential difference is caused between the P-type substrate and the N-well. Therefore, if a protection structure across the N-well and the P-type substrate is formed to resolve the problems caused by plasma damage, with this potential difference, the performance and electrical characteristics will be degraded.

SUMMARY OF THE INVENTION

A method for avoiding plasma damage is provided in the invention. In a semiconductor substrate of a first conductive type, a second conductive type well is formed. While forming the second conductive well, a dopant with high energy is doped into the semiconductor substrate. The high energy creates defects in a depletion region between the substrate and the well. A leakage path is thus formed. The leakage path can direct any charged carriers coming from plasma to a ground and thus avoid an accumulation of charged carriers in the well. Thus, the electrical characteristics of the well or even the quality of gate oxide formed thereon is prevented from being degraded.

The invention provides a method which comprises an ion implantation in a first conductive type substrate. The ion implantation comprises several implantation steps to form a uniform well in the substrate. A first step of the ion implantation is performed to determine a depth of the well and uses a second conductive type dopant with high dosage and high energy. The high dosage and high-energy dopant causes defects in a depletion region between the well and the substrate. The defects form a path which makes charged carriers from plasma pass through the well and the substrate to be grounded.

Both the foregoing general description and the following detailed description are exemplary and explanatory only and are not restrictive of the invention, as claimed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
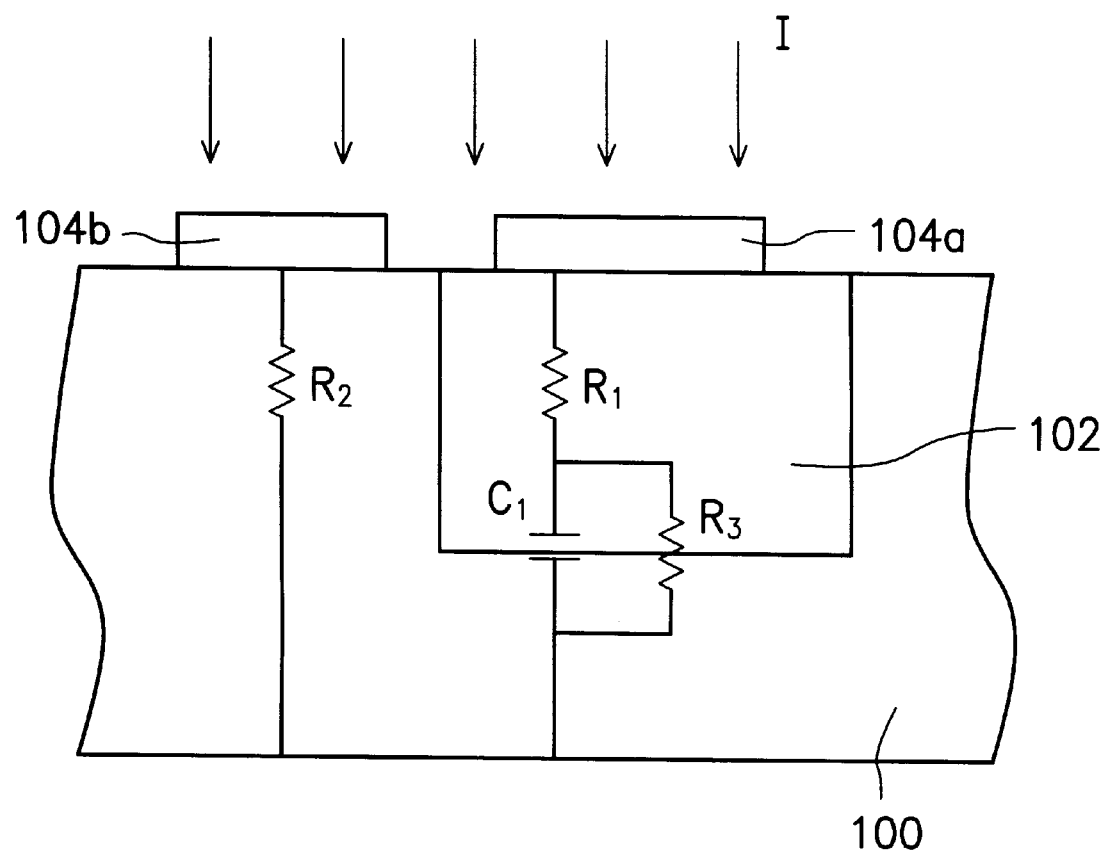
FIG. 1 is a cross-sectional view showing the structure and circuitry of one preferred embodiment of the invention, which provides a method for protecting an N-well from being damaged by plasma.

FIG. 1 is a cross-sectional view showing the structure and circuitry of one preferred embodiment of the invention, which provides a method for protecting an N-well from being damaged by plasma.

Referring to FIG. 1, in a semiconductor substrate 100 of a first conductive type, a second conductive type well 102 is formed. The substrate 100 is a P-type lightly doped region. The N-well 102 is formed in the substrate 100. Gate oxide layers 104a and 104b are respectively formed on the P-type substrate 100 and on the N-type well 102. The invention can also employ an N-type lightly doped region comprising a P-well, while the elements or devices formed subsequently have to interchange their polarities. A protection structure of a P-well can thus be formed in the same manner as follows.

While placing the substrate 100 into a plasma environment I, the substrate 100 is grounded. An electrical situation between the gate oxide layer 104a and the well 102 acts as a resistor $R_1$. There is a depletion region formed between the well 102 and the substrate 100, and thus, a parasitic capacitor $C_1$ is formed. Furthermore, in regions of the substrate 100 other than the well 102, another electrical situation between the gate oxide layer 104b and the substrate 100 acts as a resistor $R_2$. When environment I is full of charged particles, the resistors $R_1$ and $R_2$ can provide a path to direct the charged carriers towards the chuck to be grounded. However, within the well 102, the charged carriers are accumulated to damage performance of a semiconductor device.

Ion implantation is performed to form the well 102 within the substrate 100. The ion implantation usually comprises several implantation steps with different energies and different dosages to make the well 102 uniform. A first step of the ion implantation is performed to determine a depth of the well 102. The first step uses a second conductive type dopant with high energy, such as 600–900 Kev. A dopant dosage used in the first step of the invention is, for example, about 2–5 times heavier than a conventional dopant dosage of a well. The dopant dosage of the invention may be about $1\times10^{13}$–$1\times10^{14}$ atoms/cm$^2$. If the well 102 is N-type, the dopant can be phosphorus.

The first implantation step with high energy can form defects at the depletion region between the substrate 100 and the well 102. Even if the plasma environment I is full of charged carriers, these charged carriers are directed along a path, which is created by the defects, towards the chuck to be grounded. The path acts as a resistor $R_3$ as shown in FIG. 1.

Since temperature used in following processes on the substrate 100 is not higher than about 1050 Celsius degrees, the defects, which are formed from the implantation described above, would not fully removed. Remaining defects cause the leakage path via the well and the substrate to be grounded.

The invention provides a method for forming a retrograde well. However, experiment is required to choose an adequate dosage for forming the retrograde well. The leakage level between the well and the substrate must be controlled to avoid influencing device performance and quality. Then, the oxide integrity on the well is promoted and the superiority of a latch-up immunity as well as a defect-gettering ability can be maintained.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of avoiding plasma damage on a semiconductor device, comprising the steps of:

providing a semiconductor substrate having a first conductive type;

performing a first implantation step to determine a depth of a well having dopant with a second conductive type in the semiconductor substrate, wherein a leakage path is formed between the semiconductor substrate and the well; and performing a second implantation step to complete doping of the well.

2. The method according to claim 1, wherein the first conductive type is P-type and the second conductive type is N-type.

3. The method according to claim 2, wherein the dopant comprises phosphorus.

4. The method according to claim 1, wherein the first conductive type is N-type and the second conductive type is P-type.

5. The method according to claim 1, wherein a concentration of the dopant is about 2–5 times higher than a dopant concentration of a conventional well.

6. The method according to claim 1, wherein a concentration of the dopant is about $1\times10^{13}$–$1\times10^{14}$ atoms/cm$^2$.

7. The method according to claim 1, wherein the first implantation step is performed using an energy of about 600–900 Kev.

8. A method of protecting a second conductive type well at a floating stage formed in a first conductive type substrate, comprising:

forming the second conductive type well in the first conductive type substrate by performing an ion implantation process, which comprises a plurality of implantation steps, wherein a first implantation step determines a depth of the second conductive type well and forms a leakage path within the second conductive type well.

9. The method according to claim 8, wherein the first conductive type is P-type and the second conductive type is N-type.

10. The method according to claim 9, wherein a dopant comprises phosphorus.

11. The method according to claim 8, wherein the first conductive type is N-type and the second conductive type is P-type.

12. The method according to claim 8, wherein a dopant concentration of the second conductive well is about 2–5 times of a dopant concentration of a conventional well.

13. The method according to claim 8, wherein a concentration of a dopant is about $1\times10^{13}$–$1\times10^{14}$ atoms/cm$^2$.

14. The method according to claim 8, wherein the first implantation step is performed using energy of about 600–900 Kev.

* * * * *